United States Patent
Hayashi

(10) Patent No.: US 7,959,734 B2
(45) Date of Patent: Jun. 14, 2011

(54) SUBSTRATE MOUNTING STRUCTURE AND SUBSTRATE PROCESSING APPARATUS

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/020,881

(22) Filed: Jan. 28, 2008

(65) Prior Publication Data

US 2008/0181825 A1 Jul. 31, 2008

Related U.S. Application Data

(60) Provisional application No. 60/911,364, filed on Apr. 12, 2007.

(30) Foreign Application Priority Data

Jan. 31, 2007 (JP) .................................. 2007-021018

(51) Int. Cl.
 C23C 16/00 (2006.01)
 C23F 1/00 (2006.01)
 H01L 21/306 (2006.01)

(52) U.S. Cl. ........ 118/725; 118/715; 118/722; 118/724; 156/345.51; 156/345.52

(58) Field of Classification Search .................. 118/725, 118/728; 156/345.27, 345.24; 219/443, 219/444.1, 465.1, 466.1, 542, 543; 338/283, 338/306–330; 392/386, 387, 388, 389
See application file for complete search history.

(56) References Cited

U.S. PATENT DOCUMENTS

| 4,894,634 A * | 1/1990 | Nezuka et al. ................. 337/343 |
| 5,968,379 A * | 10/1999 | Zhao et al. ................ 219/121.52 |
| 6,756,568 B1 * | 6/2004 | Furukawa ................... 219/444.1 |
| 7,045,747 B2 * | 5/2006 | Futakuchiya et al. ...... 219/444.1 |
| 2003/0057198 A1 * | 3/2003 | Kobayashi et al. ........... 219/390 |
| 2004/0168641 A1 * | 9/2004 | Kuibira et al. ................ 118/728 |
| 2006/0169688 A1 * | 8/2006 | Mori et al. .................. 219/444.1 |

FOREIGN PATENT DOCUMENTS

JP 2003-124201 4/2003

* cited by examiner

*Primary Examiner* — Parviz Hassanzadeh
*Assistant Examiner* — Tiffany Nuckols
(74) *Attorney, Agent, or Firm* — Oblon, Spivak, McClelland, Maier & Neustadt, L.L.P.

(57) ABSTRACT

A substrate mounting structure that can maintain the temperature uniformity of a substrate mounted on a mounting stage. The substrate mounting structure disposed in a pressure reduced space has a base portion, a pillar portion mounted in a standing manner on the base portion and having an internal space, and a mounting stage supported on the pillar portion and having a substrate mounted thereon. The mounting stage has a heating element that heats the mounted substrate, and a thermal breaking unit that mechanically breaks an electrical power supply line connected to the heating element depending on the temperature of the substrate. The pillar portion is comprised of a thin-walled cylinder. The thermal breaking unit is disposed on the pillar portion's internal space side in the mounting stage, and the pressure in the internal space is reduced.

12 Claims, 3 Drawing Sheets

SUBSTRATE MOUNTING STRUCTURE AND SUBSTRATE PROCESSING APPARATUS

BACKGROUND OF THE INVENTION

1. Field of the Invention

The present invention relates to a substrate mounting structure and a substrate processing apparatus, and in particular to a substrate mounting structure having a mounting stage on which a substrate is heated.

2. Description of the Related Art

As substrate processing apparatuses that heat wafers as substrates, substrate processing apparatuses are known that have a processing chamber that houses a wafer and subjects the wafer to predetermined processing, and a susceptor as a mounting stage which is disposed inside the processing chamber and on which the wafer is mounted, the susceptor having therein a heater. In such a substrate processing apparatus, the susceptor is supported by a cylindrical supporting member (stem), and a power source is connected to the heater via a feed line (see, for example, Japanese Laid-Open Patent Publication (Kokai) No. 2003-124201).

Examples of the predetermined processing carried out on a heated wafer include reduction processing and Low-k restoration processing. Hydrogen gas is used in the reduction processing, and silane-based gas is used in the Low-k restoration processing. The hydrogen gas and the silane-based gas are explosive gas that tends to explode at a certain predetermined temperature (explosion limit temperature) or higher. To avoid the explosion of the explosive gas, while a wafer is being subjected to the Low-K restoration processing and the like, the temperature of the wafer being heated has to be made lower than the explosion limit temperature of the explosive gas.

Accordingly, as shown in FIG. 3, a substrate processing apparatus 102 has been developed in which temperature sensors 101 are embedded in a susceptor 100, and software operating on a PC monitors indirectly the temperature of the wafer W by monitoring the temperature of the susceptor 100 measured by, for example, a thermocouple, and when the temperature of the wafer W is likely to exceed the explosion limit temperature, the software provides control to stop the supply of electrical power to a heating element. In this substrate processing apparatus 102, the two independent temperature sensors 101 are embedded in the susceptor 100 to realize two temperature measurement lines so as to improve the reliability of heating-stop control. Moreover, the temperature sensors 101 are arranged in the central part of the susceptor 100 corresponding to the central part of the wafer W, and more specifically, at the intersection of the susceptor 100 and a stem 103 so as to improve the reliability of correlation between the measured temperature of the susceptor 100 and the temperature of the wafer W.

In the above described substrate processing apparatus 102, however, when the software runs out of control, heating-stop control cannot be properly carried out. Moreover, the possibility that the software may run out of control cannot be reduced to zero.

To cope with this, in recent years, it has been contemplated that heating-stop control is carried out without using software so as to improve the reliability of heating-stop control. Specifically, it has been contemplated that a thermostat, a temperature fuse, or the like is embedded in a susceptor, and the thermostat or the like mechanically breaks a feed line connected to a heating element depending on the temperature of the susceptor when the temperature of the susceptor (wafer) is likely to exceed the explosion limit temperature.

However, the thermostat has to be away from an atmosphere in a processing chamber, for example, a processing gas, and hence in a substrate processing apparatus that carries out heating-stop control without using software, a part of the susceptor at which the thermostat is disposed has to be covered with a stem. On the other hand, because the thermostat is larger in size than a temperature sensor, the stem has to be made thicker than the stem of the conventional substrate processing apparatus so as to cover the above-mentioned part with the stem.

Making the stem thicker increases the heat capacity of the stem, and hence the stem absorbs a considerable amount of heat generated by the heating element of the susceptor, and further, the stem functions as a heat flow path that connects the susceptor to the processing chamber, so that the most part of heat generated by the heating element is transferred to the wall of the processing chamber. As a result, heat is not properly transferred to the wafer, and hence it is difficult to maintain the temperature uniformity of the wafer.

SUMMARY OF THE INVENTION

The present invention provides a substrate mounting structure and a substrate processing apparatus that can maintain the temperature uniformity of a substrate mounted on a mounting stage.

Accordingly, in a first aspect of the present invention, there is provided a substrate mounting structure disposed in a pressure reduced space and comprising a base portion, a pillar portion mounted in a standing manner on the base portion and having an internal space, and a mounting stage supported on the pillar portion and having a substrate mounted thereon, wherein the mounting stage comprises a heating element that heats the mounted substrate, and a thermal breaking unit that mechanically breaks an electrical power supply line connected to the heating element depending on a temperature of the substrate, the pillar portion comprises a thin-walled cylinder, and the thermal breaking unit is disposed on the pillar portion's internal space side in the mounting stage, and a pressure in the internal space is reduced.

According to the first aspect of the present invention, because the electrical power supply line connected to the heating element is mechanically broken depending on the temperature of the substrate, the reliability of heating-stop control can be improved. Moreover, because the pillar portion that supports the mounting stage having the heating element is comprised of a thin-walled cylinder, and the pressure in the pillar portion's internal space is reduced, the heat capacity of the pillar portion can be reduced, and the pillar portion can be prevented from functioning as a heat flow path from the mounting stage to the base portion. Further, heat can be prevented from being transferred from the mounting stage to the base portion via the internal space. As a result, heat generated by the heating element incorporated in the mounting stage can be properly transferred to the substrate, so that the temperature of the substrate can be maintained uniform.

The first aspect of the present invention can provide a substrate mounting structure, wherein explosive gas that explodes at a predetermined temperature or higher exists in the pressure reduced space.

According to the first aspect of the present invention, although explosive gas that explodes at a predetermined temperature or higher exists in the pressure reduced space, explosion of the explosive gas can be prevented because the reliability of heating-stop control is improved.

The first aspect of the present invention can provide a substrate mounting structure, wherein the pillar portion has a wall thickness of 5 mm or less.

According to the first aspect of the present invention, because the pillar portion has a wall thickness of 5 mm or less, the heat resistance between the mounting stage and the base portion can be increased, and hence the pillar portion can be reliably prevented from functioning as a heat flow path from the mounting stage to the base portion.

Accordingly, in a second aspect of the present invention, there is provided a substrate mounting structure disposed in a pressure reduced space and comprising a base portion, a pillar portion mounted in a standing manner on the base portion and having an internal space, and a mounting stage supported on the pillar portion and having a substrate mounted thereon, wherein the mounting stage comprises a heating element that heats the mounted substrate, and a thermal breaking unit that mechanically breaks an electrical power supply line connected to the heating element depending on a temperature of the substrate, the pillar portion comprises a thin-walled cylinder, and the thermal breaking unit is disposed on the pillar portion's internal space side in the mounting stage, and the internal space is filled with a heat insulating material.

According to the second aspect of the present from functioning as a heat flow path from the mounting stage to the base portion.

Accordingly, in a third aspect of the present invention, there is provided a substrate processing apparatus comprising a processing chamber housing a substrate, a pressure in the processing chamber being reduced, and a substrate mounting structure disposed in the processing chamber, wherein explosive gas that explodes at a predetermined temperature or higher exists in the processing chamber, the substrate mounting structure comprises a base portion, a pillar portion mounted in a standing manner on the base portion and having an internal space, and a mounting stage supported on the pillar portion and having a substrate mounted thereon, the mounting stage comprises a heating element that heats the mounted substrate, and a thermal breaking unit that mechanically breaks an electrical power supply line connected to the heating element depending on a temperature of the substrate, the pillar portion comprises a thin-walled cylinder, and the thermal breaking unit is disposed on the pillar portion's internal space side in the mounting stage, and a pressure in the internal space is reduced.

According to the third aspect of the present invention, because the electrical power supply line connected to the heating element is mechanically broken depending on the temperature of the substrate, the reliability of heating-stop control can be improved, and hence explosion of explosive gas in the processing chamber can be prevented. Moreover, because the pillar portion that supports the mounting stage having the heating element is comprised of a thin-walled cylinder, and the pressure in the pillar portion's internal space is reduced, the heat capacity of the pillar portion can be reduced, and the pillar portion can be prevented from functioning as a heat flow path from the mounting stage to the base portion. Further, heat can be prevented from being transferred from the mounting stage to the base portion via the internal space. As a result, heat generated by the heating element incorporated in the mounting stage can be properly transferred to the substrate, so that the temperature of the substrate can be maintained uniform.

Accordingly, in a fourth aspect of the present invention, there is provided a substrate processing apparatus comprising a processing chamber housing a substrate, a pressure in the processing chamber being reduced, and a substrate mounting structure disposed in the processing chamber, wherein explosive gas that explodes at a predetermined temperature or higher exists in the processing chamber, the substrate mounting structure comprises a base portion, a pillar portion mounted in a standing manner on the base portion and having an internal space, and a mounting stage supported on the pillar portion and having a substrate mounted thereon, the mounting stage comprises a heating element that heats the mounted substrate, and a thermal breaking unit that mechanically breaks an electrical power supply line connected to the heating element depending on a temperature of the substrate, the pillar portion comprises a thin-walled cylinder, and the thermal breaking unit is disposed on the pillar portion's internal space side in the mounting stage, and the internal space is filled with a heat insulating material.

According to the fourth aspect of the present invention, because the electrical power supply line connected to the heating element is mechanically broken depending on the temperature of the substrate, the reliability of heating-stop control can be improved, and hence explosion of explosive gas in the processing chamber can be prevented. Moreover, because the pillar portion that supports the mounting stage having the heating element is comprised of a thin-walled cylinder, and the internal space of the pillar portion is filled with a heat insulating material, the heat capacity of the pillar portion can be reduced, and the pillar portion can be prevented from functioning as a heat flow path from the mounting stage to the base portion. Further, heat can be prevented from being transferred from the mounting stage to the base portion via the internal space. As a result, heat generated by the heating element incorporated in the mounting stage can be properly transferred to the substrate, so that the temperature of the substrate can be maintained uniform.

The features and advantages of the invention will become more apparent from the following detailed description taken in conjunction with the accompanying drawings.

DETAILED DESCRIPTION OF THE PREFERRED EMBODIMENTS

The present invention will now be described with reference to the drawings showing preferred embodiments thereof.

First, a description will be given of a substrate mounting structure and a substrate processing apparatus having the structure according to a first embodiment of the present invention.

Figure 1:
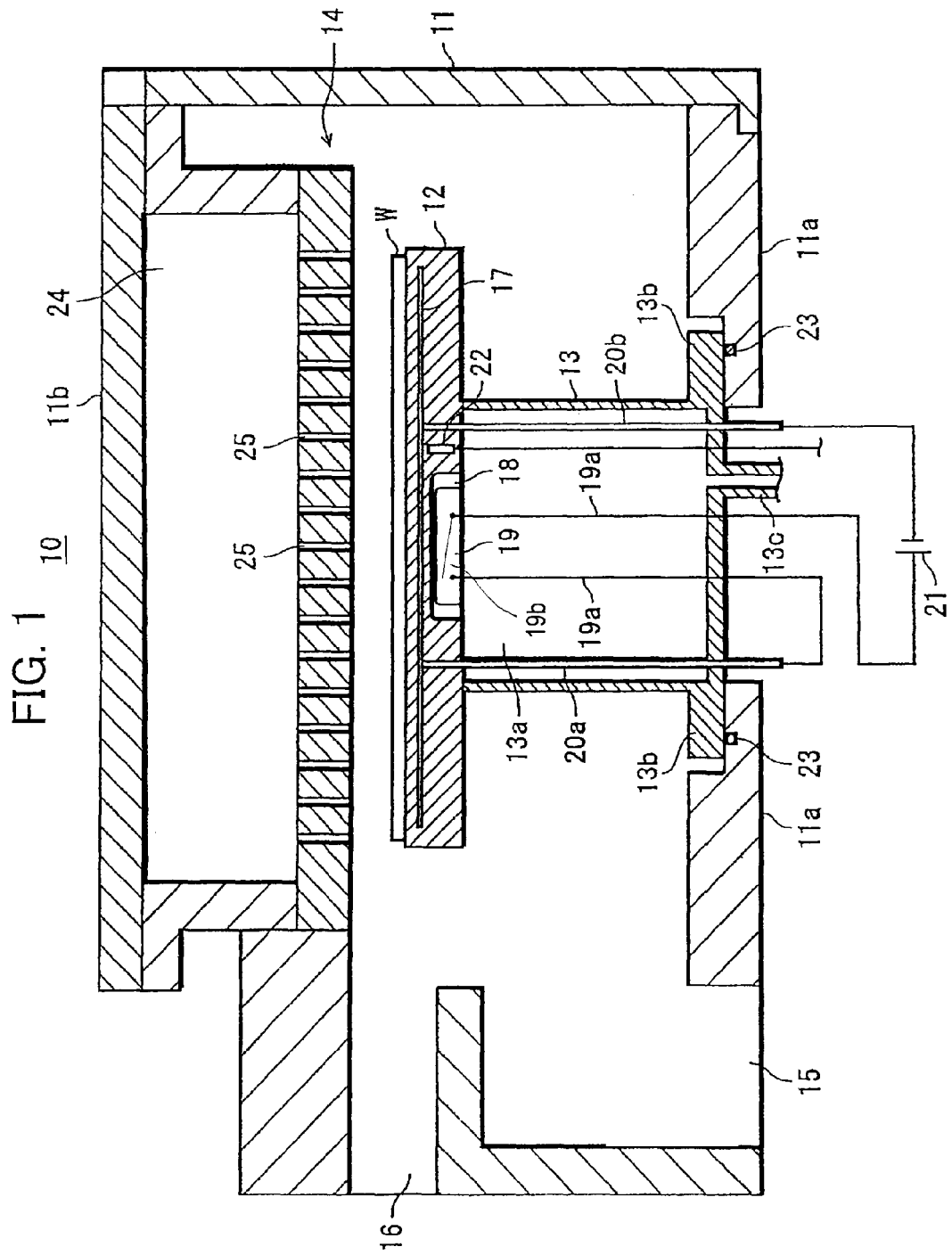
FIG. 1 is a sectional view schematically showing the constructions of a substrate mounting structure and a substrate processing apparatus having the structure according to a first embodiment of the present invention.

FIG. 1 is a sectional view schematically showing the constructions of the substrate mounting structure and the substrate processing apparatus having the structure according to the first embodiment.

As shown in FIG. 1, the substrate processing apparatus 10 has a chamber 11 (processing chamber) in which is housed a semiconductor wafer (hereinafter referred to merely as a "wafer") W (substrate) having a diameter of, for example, 300 mm. A susceptor 12 as a disk-shaped mounting stage on which is mounted the wafer W, a stem 13 (pillar portion) that is mounted in a standing manner on a bottom portion 11a (base portion) of the chamber 11 and supports the susceptor 12, a shower head 14 that is disposed in a ceiling portion 11b of the chamber 11 and faces the susceptor 12, an exhaust port 15 that communicates an exhaust unit (not shown) such as a TMP (turbo-molecular pump), a DP (dry pump), and so on and the interior of the chamber 11 together, and a transfer port 16 for transferring the wafer W into or out from the chamber 11 are disposed in the chamber 11 (pressure reduced space). The substrate processing apparatus 10 carries out Low-k restoration processing on the wafer W housed in the chamber 11.

The susceptor 12 has an electrical heater 17 (electrical heating element) disposed substantially parallel to an upper surface of the susceptor 12 and incorporated in the susceptor 12, a thermostat 19 (thermal breaking unit) housed in the concave portion 18 which provided on an under surface of the susceptor 12, and one temperature sensor 22 incorporated in the susceptor 12. On the susceptor 12, the wafer W is mounted in such a manner that the center thereof corresponds to the center of the susceptor 12.

The electrical heater 17 is connected to a power source 21 via two conductive wires 20a and 20b (electrical power supply lines) and generates heat based on supplied electrical power to heat the wafer W mounted on the upper surface of the susceptor 12. The thermostat 19 has wiring 19a (electrical power supply lines) led as two conductive wires from the thermostat 19. The thermostat 19 mechanically breaks the wiring 19a when the detected temperature is likely to exceed 200° C. Specifically, the thermostat 19 has a bimetal switch plate 19b, which changes its form according to temperature, part way along the wiring 19a. At a high temperature, the switch plate 19b becomes warped, and one end thereof moves away from the wiring 19a to mechanically break the wiring 19a.

The concave portion 18 is provided in substantially the center of the susceptor 12, and hence the thermostat 19 housed in the concave portion 18 faces the center of the wafer W. Thus, there is a high degree of correlation between the temperature of the wafer W and the temperature detected by the thermostat 19, and hence the thermostat 19 mechanically breaks the wires 19a according to the temperature of the wafer W.

Moreover, the wiring 19a led from the thermostat 19 is connected to the conductive wire 20a and the power source 21, and hence the thermostat 19 is interposed just like an electrical circuit between the power source 21 and the electrical heater 17. Therefore, the thermostat 19 controls the supply of electrical power to the electrical heater 17 according to the temperature of the wafer W. Specifically, the thermostat 19 mechanically breaks the wiring 19a (conductive wire 20a) when the temperature of the wafer W is likely to exceed 200° C.

In the susceptor 12, the temperature sensor 22 is disposed adjacent to the concave portion 18. Therefore, the temperature sensor 22 can be made close to the center of the wafer W, and hence a high degree of correlation between the temperature of the wafer W and the temperature detected by the temperature sensor 22 can be realized. Moreover, the temperature sensor 22 is connected to a PC (not shown), so that the measured temperature is converted into an electrical signal, which is in turn transmitted to the PC. In the PC, when it is determined that the temperature of the wafer W is likely to exceed 200° C. based on the transmitted electrical signal, software controls the power source 21 to stop the supply of electrical power to the electrical heater 17.

As described above, in the substrate processing apparatus 10, the supply of electrical power to the electrical heater 17 is controlled through two lines, i.e. the thermostat 19 and the software.

The stem 13 is comprised of a thin-walled cylinder having an internal space 13a, and the wall thickness of the stem 13 is set to 5 mm or less. The stem 13 supports the susceptor 12 in such a manner that the central axis of the stem 13 corresponds to the center of the susceptor 12. Thus, in the susceptor 12, the thermostat 19 housed in the concave portion 18 provided in substantially the center of the susceptor 12 is disposed on the stem 13's internal space 13a side and exposed to the internal space 13a of the stem 13. Moreover, the diameter of the internal space 13a is set to be at least greater than that of the opening of the concave portion 18 in a lower surface of the susceptor 12. Thus, the thermostat 19 is isolated from silane-based gas, described later, supplied into the chamber 11 by the side wall of the stem 13. It should be noted that the conductive wires 20a and 20b, the wiring 19a, and wiring of the temperature sensor 22 are disposed in the internal space 13a and isolated from silane-based gas, described later.

A flange 13b is formed in a lower part of the stem 13, and the bottom portion 11a of the chamber 11 abuts on the flange 13b. An O-ring 23 as a seal member is interposed between the bottom portion 11a and the flange 13b so as to prevent the interior of the chamber 11 from communicating with the outside. Moreover, an exhaust port 13c is provided in the lower part of the stem 13, and the pressure in the internal space 13a is reduced by the exhaust port 13c, so that the internal space 13a is maintained under vacuum. It should be noted that, to prevent vacuum discharge from the conductive wires 20a and 20b and the wiring 19a, measures are taken to insulate the conductive wires 20a and 20b and the wiring 19a, for example, the surfaces of the wires 20a and 20b and the wiring 19a are each covered with a thick insulating film.

In the present embodiment, the susceptor 12, the stem 13, and the bottom portion 11a of the chamber 11 constitute the substrate mounting structure.

The shower head 14 has a buffer chamber 24 formed therein, and a plurality of gas holes 25 that communicate the buffer chamber 24 to the chamber 11. A processing gas introducing pipe (not shown) is connected to the buffer chamber 24, and a processing gas such as silane-based gas (explosive gas) introduced from the processing gas introducing pipe into the buffer chamber 24 is supplied into the chamber 11 via the gas holes 25. Moreover, the exhaust port 15 reduces the pressure in the chamber 11 down to a pressure suitable for Low-k restoration processing (hereinafter referred to as "the processing pressure") and maintains the processing pressure.

In the substrate processing apparatus 10, in carrying out the Low-K restoration processing, a wafer W with a damaged Low-K film is transferred into the chamber 11 and mounted on the upper surface of the susceptor 12, the pressure in the chamber 11 is reduced down to the processing pressure by the exhaust port 15, electrical power is supplied to the electrical heater 17 to heat the wafer W, and silane-based gas is supplied from the shower head 14 toward the wafer W. At this time, the damaged Low-k film reacts with the silane-based gas and restores.

In the Low-k restoration processing, the temperature sensor 22 measures the temperature of the wafer W, and the thermostat 19 detects the temperature of the wafer W. There is a danger that silane-based gas may explode at a predetermined temperature, for example, 200° C. (hereinafter referred to as "the explosion limit temperature") or higher, and hence when the temperature of the wafer W measured by the temperature sensor 22 is likely to exceed the explosion limit temperature, the software of the PC controls the power source 21 to stop the supply of electrical power to the electrical heater 17. Also, when the temperature of the wafer W detected by the thermostat 19 is likely to exceed the explosion limit temperature, the thermostat 19 mechanically breaks the wiring 19a to stop the supply of electrical power to the electrical heater 17. This prevents the explosion of silane-based gas.

When the electrical heater 17 is heated, there is a possibility that the stem 13 absorbs the heat of the electrical heater 17 via the susceptor 12 and functions as a heat flow path that connects the susceptor 12 to the bottom portion 11a of the chamber 11, so that the heat of the electrical heater 17 is transferred to the bottom portion 11a and further transferred from the susceptor 12 to the bottom portion 11a via the internal space 13a In the substrate processing apparatus 10, because the wall thickness of the stem 13 is set to 5 mm or less, the stem 13 has a small heat capacity and absorbs only a small amount of heat of the electrical heater 17. Moreover, the heat resistance of the stem 13 is increased, and the stem 13 is prevented from functioning as a heat flow path. Further, because the internal space 13a is maintained under vacuum, the heat of the electrical heater 17 is prevented from being transferred from the susceptor 12 to the bottom portion 11a.

According to the substrate mounting structure and the substrate processing apparatus having the substrate mounting structure according to the present embodiment, because the wiring 19a (conductive wire 20a) connected to the electrical heater 17 is mechanically broken depending on the temperature of the wafer W, heat generation of the electrical heater 17 can be reliably controlled to be stopped, and hence explosion of silane-based gas in the chamber 11 can be prevented. Moreover, because the stem 13 supporting the susceptor 12 having the electrical heater 17 is comprised of the thin-walled cylinder, and the internal space 13a of the stem 13 is maintained under vacuum, the heat capacity of the stem 13 can be reduced, and the stem 13 can be prevented from functioning as a heat flow path from the susceptor 12 to the bottom portion 11a. Further, heat of the electrical heater 17 can be prevented from being transferred from the susceptor 12 to the bottom portion 11a via the internal space 13a. As a result, heat generated by the electrical heater 17 can be properly transferred to the wafer W, so that the temperature of the wafer W can be maintained uniform.

In particular, because the wall thickness of the stem 13 is 5 mm or less in the substrate processing apparatus 10, the heat resistance between the susceptor 12 and the bottom portion 11a can be increased, and hence the stem 13 can be reliably prevented from functioning as a heat flow path from the susceptor 12 to the bottom portion 11a.

Next, a description will be given of a substrate processing apparatus according to a second embodiment of the present invention.

The present embodiment is basically the same as the first embodiment described above in terms of construction and operation, differing from the first embodiment in the construction of the stem. Features of the construction and operation that are the same as in the first embodiment will thus not be described, only features that are different from those of the first embodiment being described below.

Figure 2:
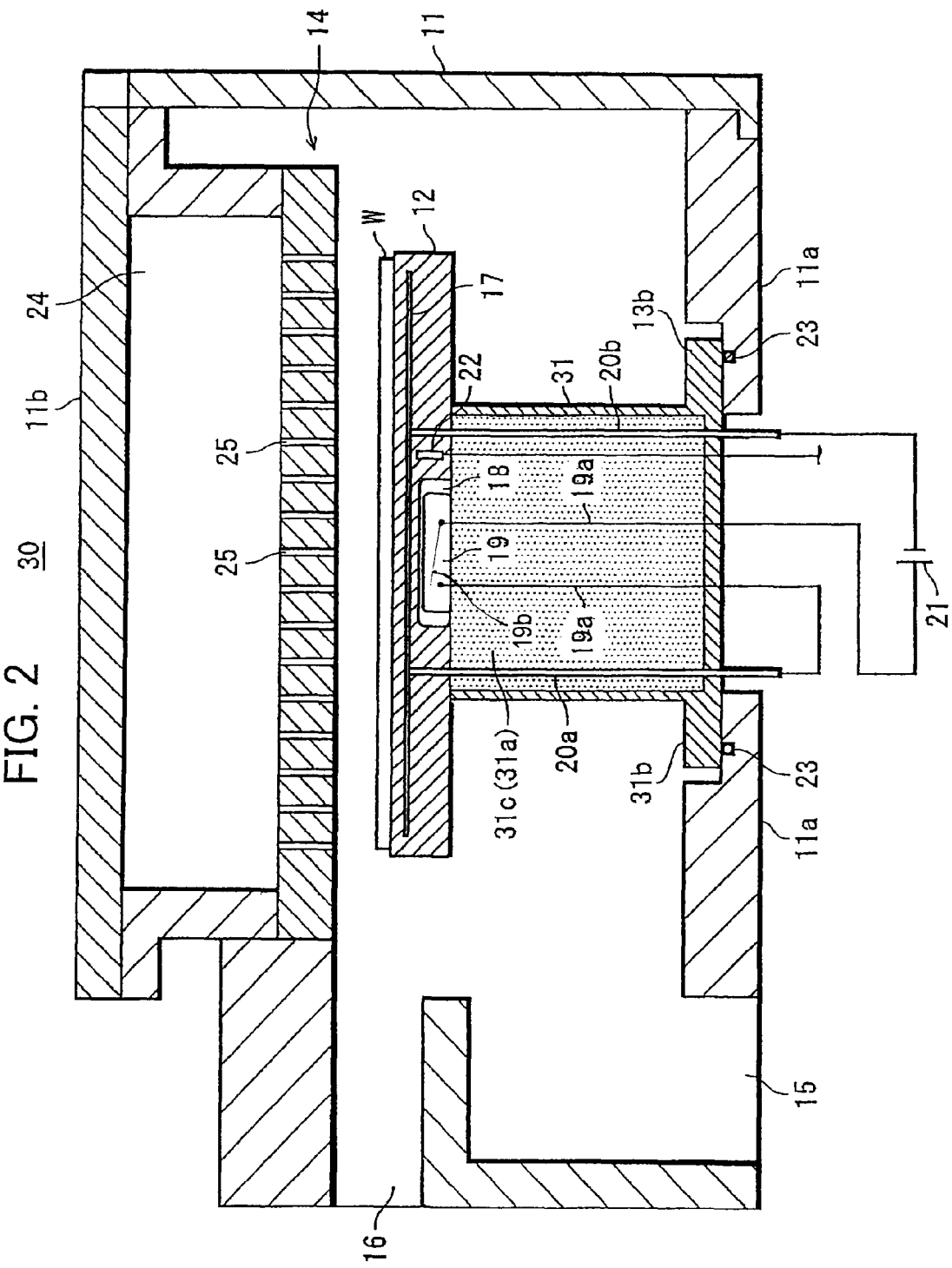
FIG. 2 is a sectional view schematically showing the constructions of a substrate mounting structure and a substrate processing apparatus having the structure according to a second embodiment of the present invention.
Figure 3:
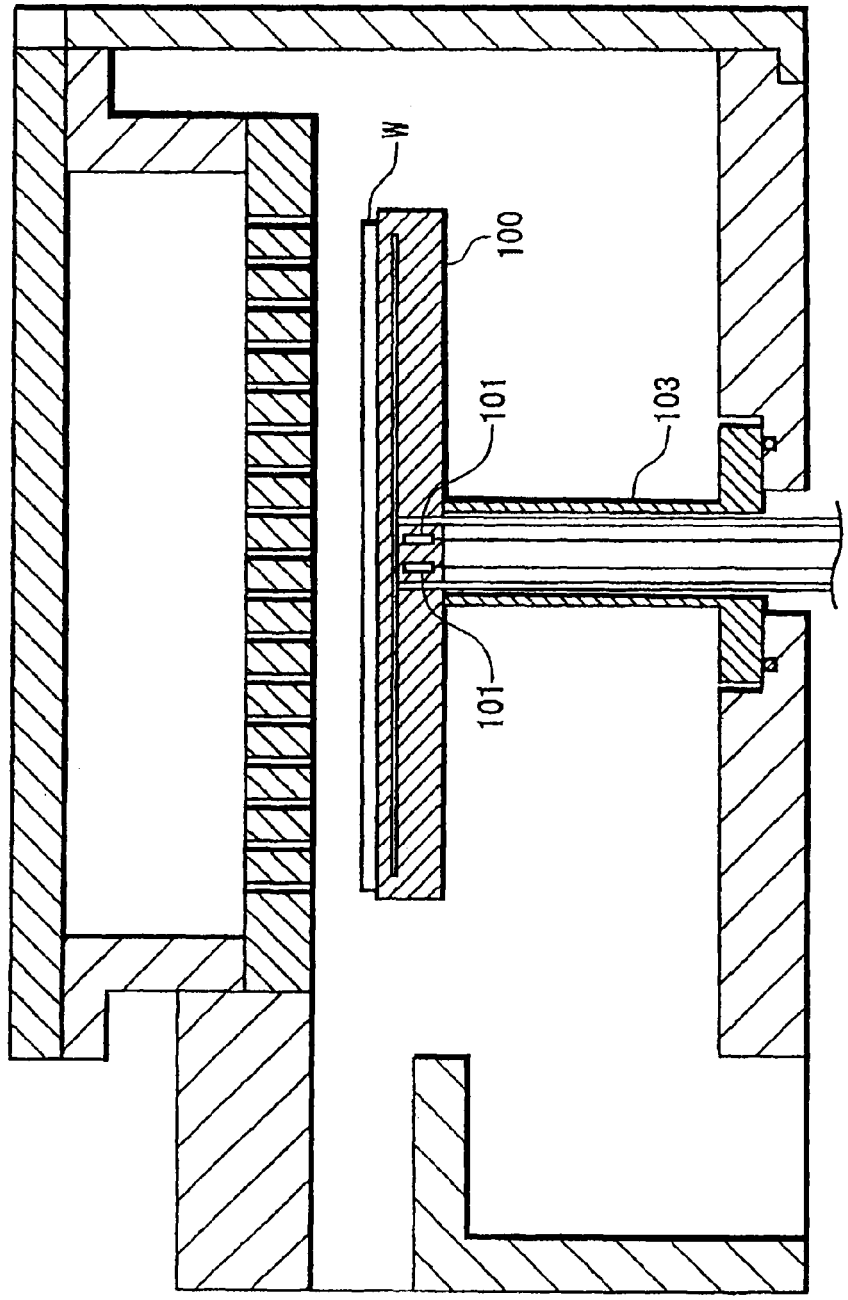
FIG. 3 is a sectional view schematically showing the construction of a conventional substrate processing apparatus.

FIG. 2 is a sectional view schematically showing the constructions of the substrate mounting structure and the substrate processing apparatus having the structure according to the second embodiment.

As shown in FIG. 2, the substrate processing apparatus 30 has a stem 31 (pillar portion) in place of the stem 13. The dimensions of the stem 31 are the same as those of the stem 13. Moreover, similarly to the stem 13, the stem 31 has an internal space 31a, and a flange 31b is formed in a lower part of the stem 31.

The internal space 31a of the stem 31 is filled with a heat insulating material 31c, for example, urethane foam. Therefore, heat of the electrical heater 17 is prevented from being transferred from the susceptor invention, because the electrical power supply line connected to the heating element is mechanically broken depending on the temperature of the substrate, the reliability of heating-stop control can be improved. Moreover, because the pillar portion that supports the mounting stage having the heating element is comprised of a thin-walled cylinder, and the internal space of the pillar portion is filled with an insulating material, the heat capacity of the pillar portion can be reduced, and the pillar portion can be prevented from functioning as a heat flow path from the mounting stage to the base portion. Further, heat can be prevented from being transferred from the mounting stage to the base portion via the internal space. As a result, heat generated by the heating element incorporated in the mounting stage can be properly transferred to the substrate, so that the temperature of the substrate can be maintained uniform.

The second aspect of the present invention can provide a substrate mounting structure, wherein explosive gas that explodes at a predetermined temperature or higher exists in the pressure reduced space.

According to the second aspect of the present invention, although explosive gas that explodes at a predetermined temperature or higher exists in the pressure reduced space, explosion of the explosive gas can be prevented because the reliability of heating-stop control is improved.

The second aspect of the present invention can provide a substrate mounting structure, wherein the pillar portion has a wall thickness of 5 mm or less.

According to the second aspect of the present invention, because the pillar portion has a wall thickness of 5 mm or less, the heat resistance between the mounting stage and the base portion can be increased, and hence the pillar portion can be reliably prevented 12 to the bottom portion 11a via the internal space 31a. It should be noted that in the present embodiment, because the internal space 31a does not have to be maintained under vacuum, and there is no possibility that vacuum discharge occurs, the surfaces of the conductive wires 20a and 20b and the wiring 19a do not have to be covered with a thick insulating film.

According to the substrate mounting structure and the substrate processing apparatus having the substrate mounting structure according to the present embodiment, the stem 31 not only supports the susceptor 12 having the electrical heater 17 is comprised of a thin-walled cylinder, but also has the internal space 31a of the stem 31 filled with the heat insulating material 31c. Therefore, the stem 31 is not only reduced in heat capacity and prevented from functioning as a heat flow path from the susceptor 12 to the bottom portion 11a, but also prevents heat of the electrical heater 17 from being transferred from the susceptor 12 to the bottom portion 11a via the internal space 31a. As a result, heat generated by the electrical heater 17 can be properly transferred to the wafer W, and the temperature of the wafer W can be maintained uniform.

Although in the above described embodiments, a thermostat is used as a device that mechanically breaks the wiring 19a (conductive wire 20a) depending on the temperature of the wafer W, that is, a thermal breaking device, a thermal breaking device that can be applied to the present invention is not limited to this. Any device other than a thermostat, such as a temperature fuse, may be used insofar as it can mechanically break the wiring 19a (conductive wire 20a) depending on the temperature of the wafer W. In this case, the temperature fuse has to be interposed just like an electrical circuit between the power source 21 and the electrical heater 17.

Further, although in the above described embodiments, the thermostat 19 is disposed in such a manner as to be exposed to the internal space 13*a* (31*a*) of the stem 13 (31), the thermostat 19 may be incorporated in the susceptor 12. In this case, however, the thermostat 19 is disposed on the stem 13's internal space 13*a* side in the susceptor 12.

Although in the above described embodiments, silane-based gas is used as explosive gas used in the substrate processing apparatus tending to explode at the explosion limit temperature or higher, this is not limitative, but for example, hydrogen gas used in reduction processing may be used.

It should be noted that in the above described embodiments, although a substrate is a semiconductor wafer W, this is not limitative, a glass substrate such as an LCD (liquid crystal display) or an FPD (flat panel display may be used.

What is claimed is:

1. A substrate mounting structure disposed in a pressure reduced space, comprising:
    a base portion;
    a pillar portion mounted in a standing manner on said base portion and having an internal space, said pillar portion being a thin-walled cylinder; and
    a mounting stage supported on said pillar portion and having a substrate mounted thereon,
    said mounting stage including
        a heating element that heats the mounted substrate,
        a controller that controls an electrical power supplied to said heating element based on an electrical signal to which a temperature of the substrate is converted, and
        a thermal breaking unit that mechanically breaks and connects an electrical power supply line connected to said heating element depending on a temperature of the substrate independently from the control of said controller,
    wherein said thermal breaking unit is disposed on a side of the internal space of the pillar portion in said mounting stage,
    wherein a pressure in the internal space is reduced,
    wherein said mounting stage, which is disk-shaped, includes a concave portion disposed centrally on an under surface of the mounting stage, said thermal breaking unit being housed in the concave portion so as to face a center of the mounted substrate, and
    wherein said heating element and said electrical power supply line are connected to each other at a portion of the mounting stage other than at the concave portion of said mounting stage.

2. A substrate mounting structure according to claim 1, wherein explosive gas that explodes at a predetermined temperature or higher exists in the pressure reduced space.

3. A substrate mounting structure according to claim 1, wherein said pillar portion has a wall thickness of 5 mm or less.

4. A substrate mounting structure according to claim 1, wherein said thermal breaking unit has a bimetal switch plate, which changes its form depending on a temperature, part way along the electrical power supply line, and wherein at a high temperature, the switch plate becomes warped, and one end thereof moves away from the electrical power supply line such as to mechanically break the electrical power supply line.

5. A substrate mounting structure according to claim 1, wherein said pillar portion is comprised of a cylinder, and a diameter of the internal space is set to be at least greater than that of an opening of the concave portion.

6. A substrate mounting structure disposed in a pressure reduced space, comprising:
    a base portion;
    a pillar portion mounted in a standing manner on said base portion and having an internal space, said pillar portion being a thin-walled cylinder; and
    a mounting stage supported on said pillar portion and having a substrate mounted thereon, said mounting stage including
        a heating element that heats the mounted substrate,
        a controller that controls an electrical power supplied to said heating element based on an electrical signal to which a temperature of the substrate is converted, and
        a thermal breaking unit that mechanically breaks and connects an electrical power supply line connected to said heating element depending on a temperature of the substrate independently from the control of said controller,
    wherein said thermal breaking unit is disposed on a side of the internal space of the pillar portion in said mounting stage,
    wherein the internal space is filled with a heat insulating material,
    wherein said mounting stage, which is disk-shaped, includes a concave portion disposed centrally on an under surface of the mounting stage, said thermal breaking unit being housed in the concave portion so as to face a center of the mounted substrate, and
    wherein said heating element and said electrical power supply line are connected to each other at a portion of the mounting stage other than at the concave portion of said mounting stage.

7. A substrate mounting structure according to claim 6, wherein explosive gas that explodes at a predetermined temperature or higher exists in the pressure reduced space.

8. A substrate mounting structure according to claim 6, wherein said pillar portion has a wall thickness of 5 mm or less.

9. A substrate mounting structure according to claim 6, wherein said thermal breaking unit has a bimetal switch plate, which changes its form depending on a temperature, part way along the electrical power supply line, and wherein at a high temperature, the switch plate becomes warped, and one end thereof moves away from the electrical power supply line such as to mechanically break the electrical power supply line.

10. A substrate mounting structure according to claim 6, wherein said pillar portion is comprised of a cylinder, and a diameter of the internal space is set to be at least greater than that of an opening of the concave portion.

11. A substrate processing apparatus comprising:
    a processing chamber housing a substrate, a pressure in said processing chamber being reduced, and
    a substrate mounting structure disposed in said processing chamber, wherein explosive gas that explodes at a predetermined temperature or higher exists in said processing chamber, said substrate mounting structure including
        a base portion,
        a pillar portion mounted in a standing manner on said base portion and having an internal space, said pillar portion being a thin-walled cylinder, and
        a mounting stage supported on said pillar portion and having a substrate mounted thereon, said mounting stage including a heating element that heats the mounted substrate,
a controller that controls an electrical power supplied to said heating element based on an electrical signal to which a temperature of the substrate is converted, and
a thermal breaking unit that mechanically breaks and connects an electrical power supply line connected to said heating element depending on a temperature of the substrate independently from the control of said controller,
wherein said thermal breaking unit is disposed on a side of the internal space of the pillar portion in said mounting stage,
wherein a pressure in the internal space is reduced,
wherein said mounting stage, which is disk-shaped, includes a concave portion disposed centrally on an under surface of the mounting stage, said thermal breaking unit being housed in the concave portion so as to face a center of the mounted substrate, and
wherein said heating element and said electrical power supply line are connected to each other at a portion of the mounting stage other than at the concave portion of said mounting stage.

12. A substrate processing apparatus comprising:
a processing chamber housing a substrate, a pressure in said processing chamber being reduced, and
a substrate mounting structure disposed in said processing chamber, wherein explosive gas that explodes at a predetermined temperature or higher exists in said processing chamber, said substrate mounting structure including
a base portion,
a pillar portion mounted in a standing manner on said base portion and having an internal space, said pillar portion being a thin-walled cylinder, and
a mounting stage supported on said pillar portion and having a substrate mounted thereon, said mounting stage including
a heating element that heats the mounted substrate,
a controller that controls an electrical power supplied to said heating element based on an electrical signal to which a temperature of the substrate is converted, and
a thermal breaking unit that mechanically breaks and connects an electrical power supply line connected to said heating element depending on a temperature of the substrate independently from the control of said controller,
wherein said thermal breaking unit is disposed on a side of the internal space of the pillar portion in said mounting stage,
wherein the internal space is filled with a heat insulating material,
wherein said mounting stage, which is disk-shaped, includes a concave portion disposed centrally on an under surface of the mounting stage, said thermal breaking unit being housed in the concave portion so as to face a center of the mounted substrate, and
wherein said heating element and said electrical power supply line are connected to each other at a portion of the mounting stage other than at the concave portion of said mounting stage.

* * * * *